US012692593B2

(12) United States Patent
Ahn et al.

(10) Patent No.: US 12,692,593 B2
(45) Date of Patent: Jul. 28, 2026

(54) LOW TEMPERATURE SYNTHESIS METHOD OF TWO DIMENSIONAL MATERIAL

(71) Applicant: UIF (University Industry Foundation), Yonsei University, Seoul (KR)

(72) Inventors: Jong-Hyun Ahn, Seoul (KR); Ahn Tuan Hoang, Seoul (KR); Beom Jin Kim, Seoul (KR); Luhing Hu, Seoul (KR)

(73) Assignee: UIF (UNIVERSITY INDUSTRY FOUNDATION), YONSEI UNIVERSITY, Seoul (KR)

( * ) Notice: Subject to any disclaimer, the term of this patent is extended or adjusted under 35 U.S.C. 154(b) by 135 days.

(21) Appl. No.: 18/773,528

(22) Filed: Jul. 15, 2024

(65) Prior Publication Data

US 2025/0027193 A1 Jan. 23, 2025

(30) Foreign Application Priority Data

Jul. 18, 2023 (KR) ........................ 10-2023-0093415

(51) Int. Cl.
C23C 16/30 (2006.01)
C23C 16/06 (2006.01)
(Continued)

(52) U.S. Cl.
CPC ............ C23C 16/305 (2013.01); C23C 16/06 (2013.01); C23C 16/448 (2013.01); H10P 14/3436 (2026.01)

(58) Field of Classification Search
CPC ...... C23C 16/305; C23C 16/06; C23C 16/448
See application file for complete search history.

(56) References Cited

U.S. PATENT DOCUMENTS

2005/0053542 A1 3/2005 Harutyunyan
2015/0111392 A1* 4/2015 Ishii .................... H01L 21/0262
438/758
(Continued)

FOREIGN PATENT DOCUMENTS

JP 6934020 B2 9/2021
JP 2023030233 A * 3/2023 ............. G01N 27/04
(Continued)

OTHER PUBLICATIONS

Palchoudhury, Soubantika, et al., "Transition metal chalcogenides for next-generation energy storage". Nanoscale Advances, 2023, 5, 2724-2742.*
(Continued)

*Primary Examiner* — Bret P Chen
(74) *Attorney, Agent, or Firm* — Maschoff Brennan

(57) ABSTRACT

A synthesis method of a 2D material according to the present disclosure includes preparing a substrate; maintaining a first zone of a furnace and a second zone adjacent to the first zone, in which the target substrate is disposed, at a first temperature and a second temperature which is lower than the first temperature; injecting carrier gas, a transition metal precursor, and a chalcogenide precursor into the first zone of the furnace; and depositing transition metal dichalcogenide on the target substrate in the second zone at the second temperature by the chemical vapor deposition.

16 Claims, 11 Drawing Sheets

(51) Int. Cl.
  *C23C 16/448*      (2006.01)
  *H10P 14/20*      (2026.01)

(56)            References Cited

U.S. PATENT DOCUMENTS

| | | | | |
|---|---|---|---|---|
| 2016/0168694 A1* | 6/2016 | Min | ......................... | C23C 16/44 |
| | | | | 427/255.31 |
| 2016/0314968 A1* | 10/2016 | Kim | .................. | H01L 21/02381 |
| 2017/0011916 A1* | 1/2017 | Lee | ..................... | C23C 14/5806 |
| 2017/0051400 A1 | 2/2017 | Choi et al. | | |
| 2017/0345944 A1* | 11/2017 | Lin | .................... | H10D 30/6734 |
| 2020/0161129 A1* | 5/2020 | Mattinen | ........... | H01L 21/02568 |
| 2020/0212080 A1* | 7/2020 | Ahn | ......................... | H10F 30/00 |
| 2021/0313576 A1* | 10/2021 | Choi | ................... | H01M 4/5815 |
| 2022/0316054 A1* | 10/2022 | Cheng | .................. | C23C 16/305 |

FOREIGN PATENT DOCUMENTS

| | | | | | |
|---|---|---|---|---|---|
| KR | 10-2008-0104574 | * | 12/2008 | .......... | H01L 27/146 |
| KR | 10-1591833 B1 | | 2/2016 | | |
| KR | 10-1703814 | * | 2/2017 | ............ | C30B 25/00 |
| KR | 10-2017-0048873 A | | 5/2017 | | |
| KR | 10-2017-0073098 | * | 6/2017 | ............ | C01B 17/20 |
| KR | 10-2019-0074627 | * | 6/2019 | ............ | C23C 16/40 |
| KR | 10-1986117 B1 | | 6/2019 | | |
| KR | 10-2021-0016859 | * | 2/2021 | .......... | H01L 21/285 |
| KR | 10-2022-0132754 | * | 10/2022 | .......... | C23C 16/448 |
| WO | 2017/194955 A1 | | 11/2017 | | |

OTHER PUBLICATIONS

Heine, Thomas, "Transition Metal Chalcogenides: Ultrathin Inorganic Materials with Tunable Electronic Properties". Accounts of Chemical Research, 2015, 48, 65-72.*

Choi, Jungwook, et al., "Understanding Solvent Effects on the Properties of Two-Dimensional Transition Metal Dichalcogenides". ACS Appl. Mater. Interfaces 2016, 8, 8864-8869.*

Ang, Edison Huixiang, et al., "Two-Dimensional Transition-Metal Dichalcogenide-Based Membrane for Ultrafast Solvent Permeation". Chemistry of Materials, 2019, 31, 10002-10007.*

Choudhary, Nitin, et al., "Two-dimensional transition metal dichalcogenide hybrid materials for energy applications". Nano Today 19 (2018) pp. 16-40.*

KR Office Action dated Jun. 26, 2025 as received in Application No. 10-2023-0093415.

* cited by examiner

[FIG. 1]
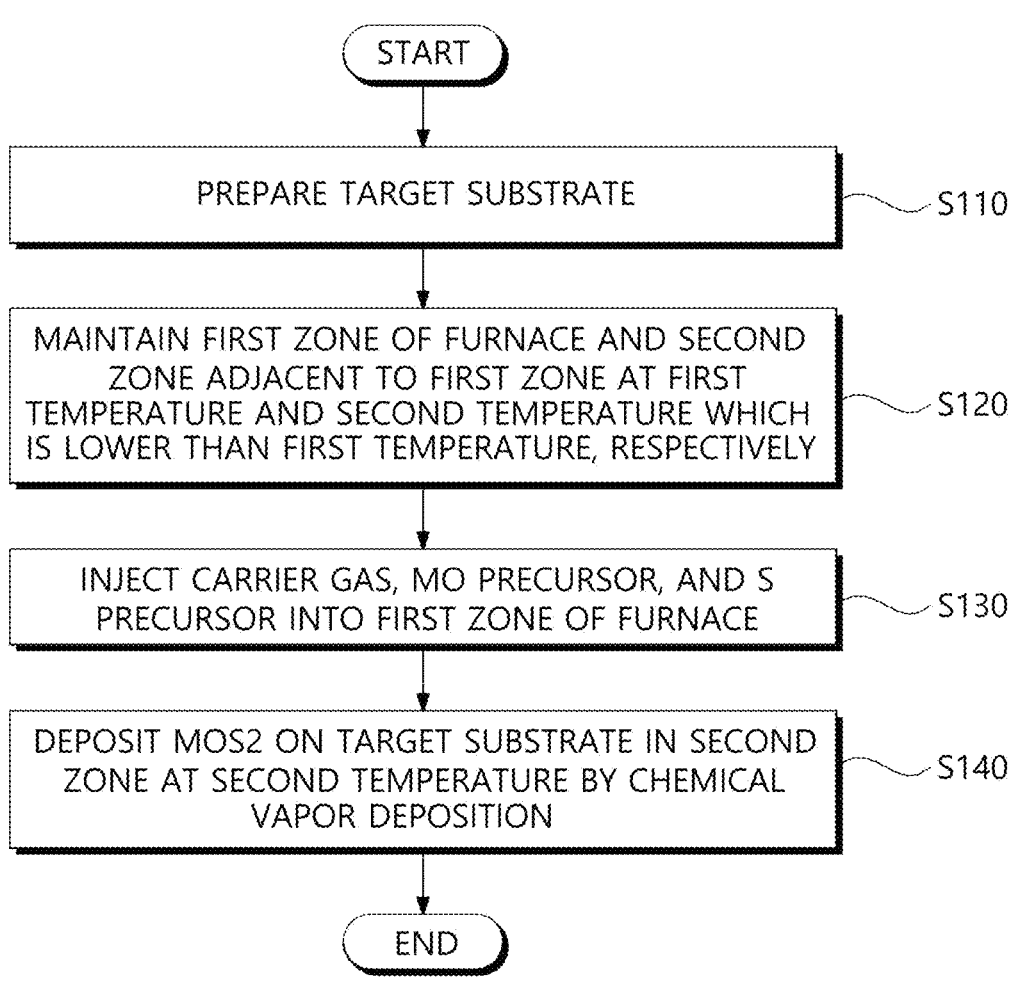

[FIG. 2]
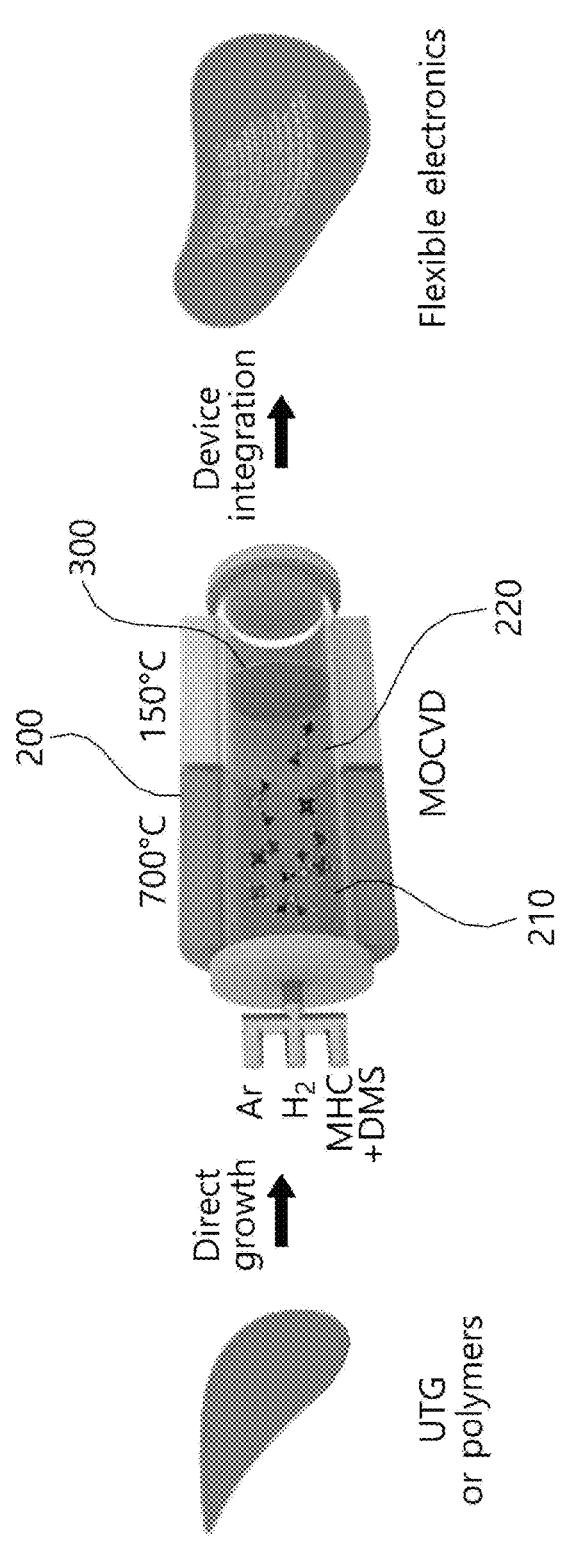

[FIG. 3]
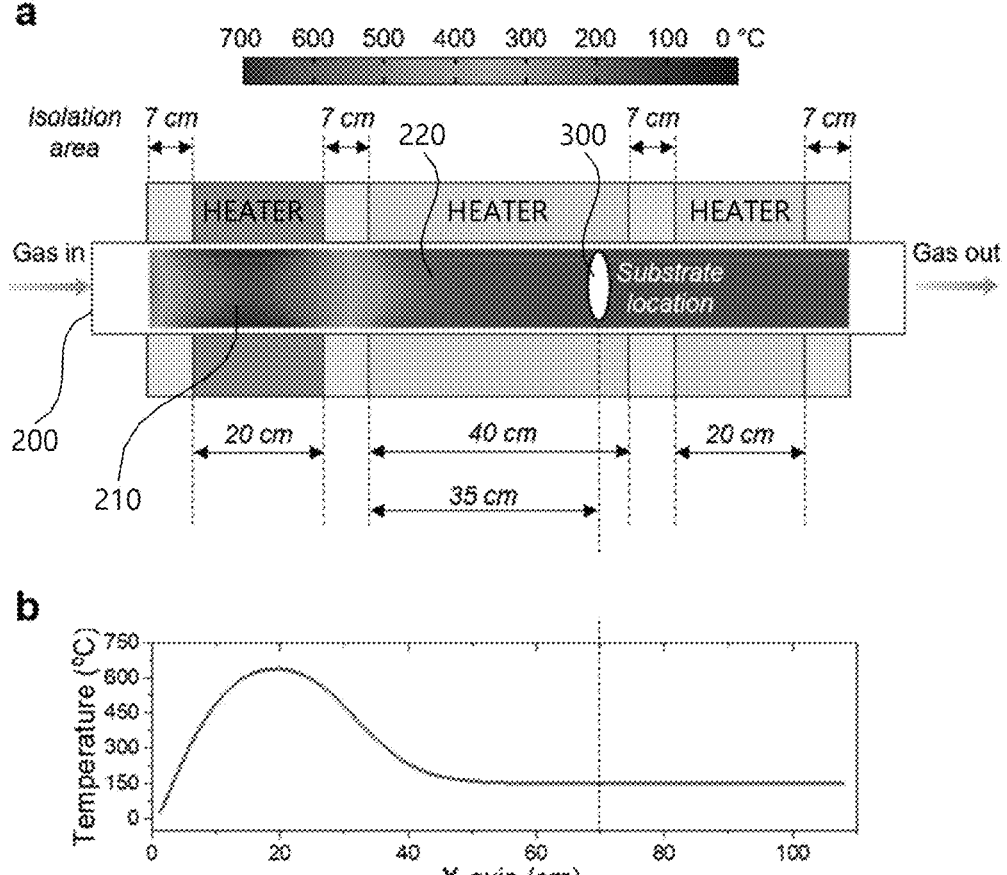
[FIG. 4]
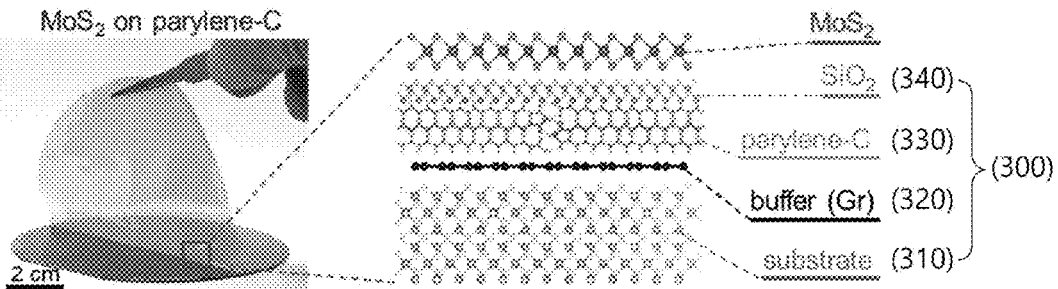

[FIG. 5]
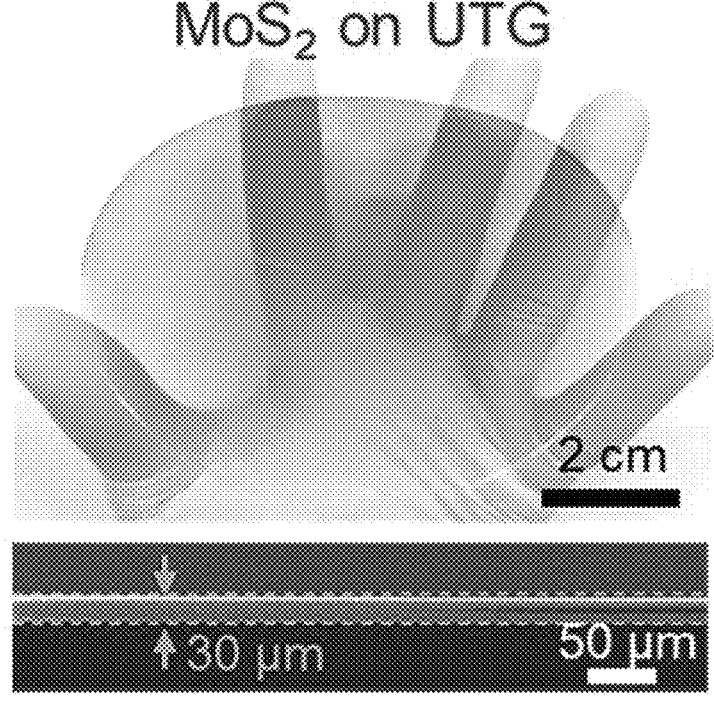
[FIG. 6]
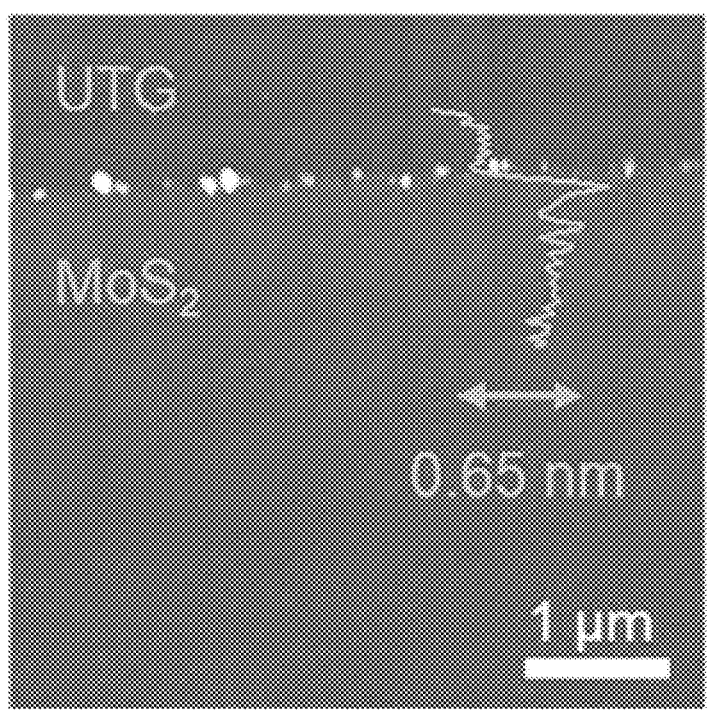

[FIG. 7]
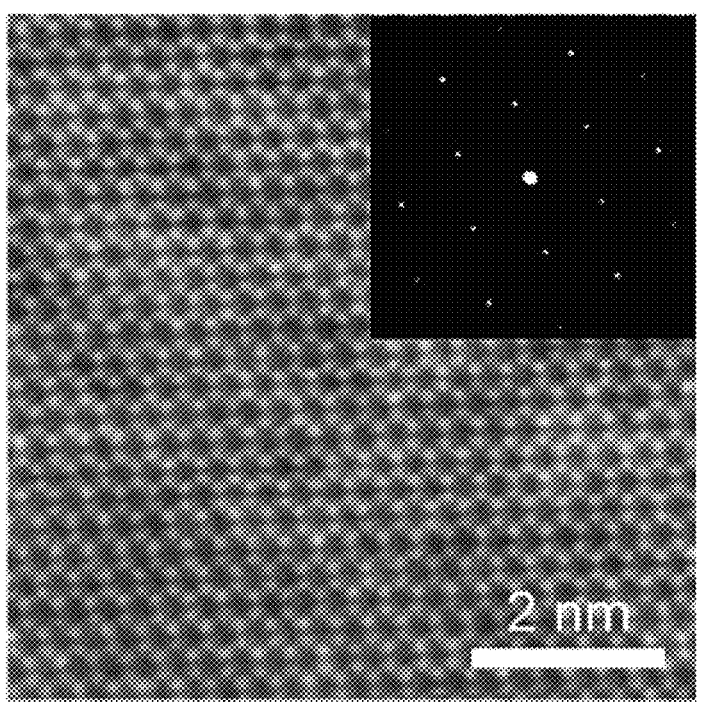
[FIG. 8]
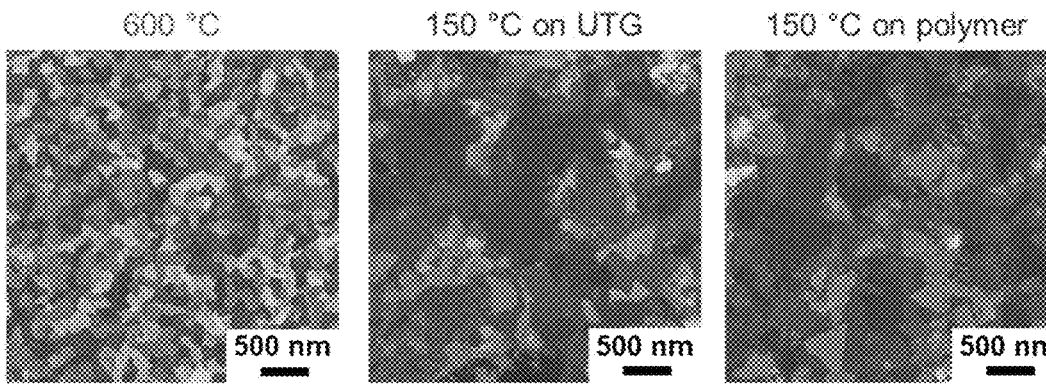

[FIG. 9]
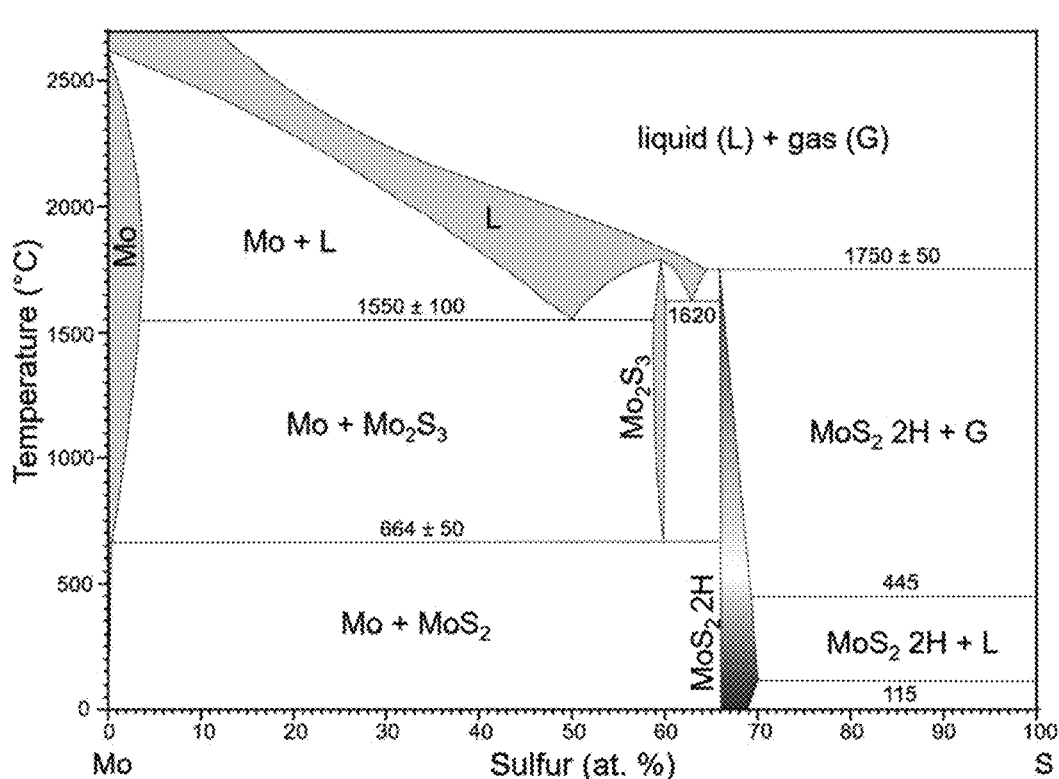

[FIG. 10]
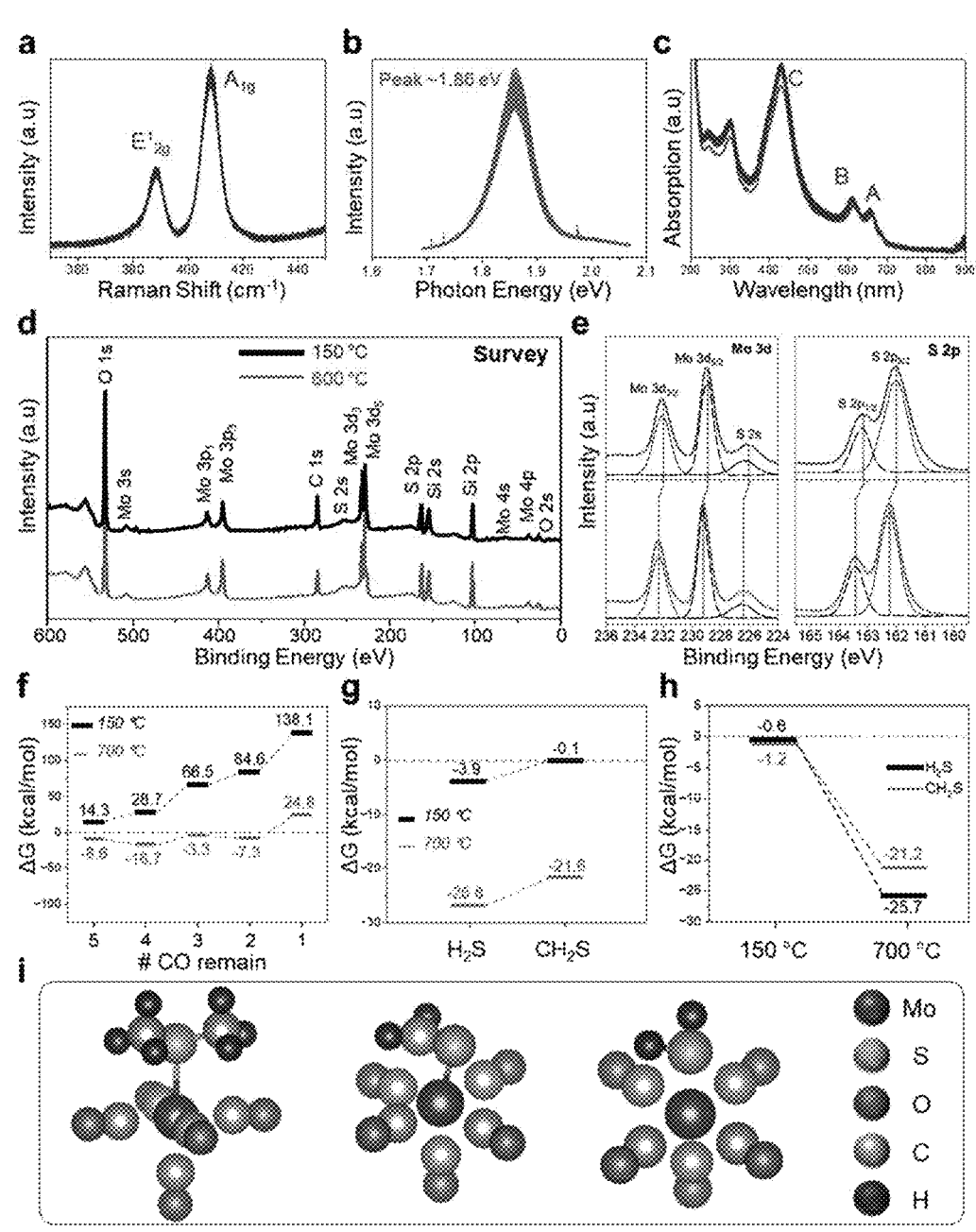

[FIG. 11]
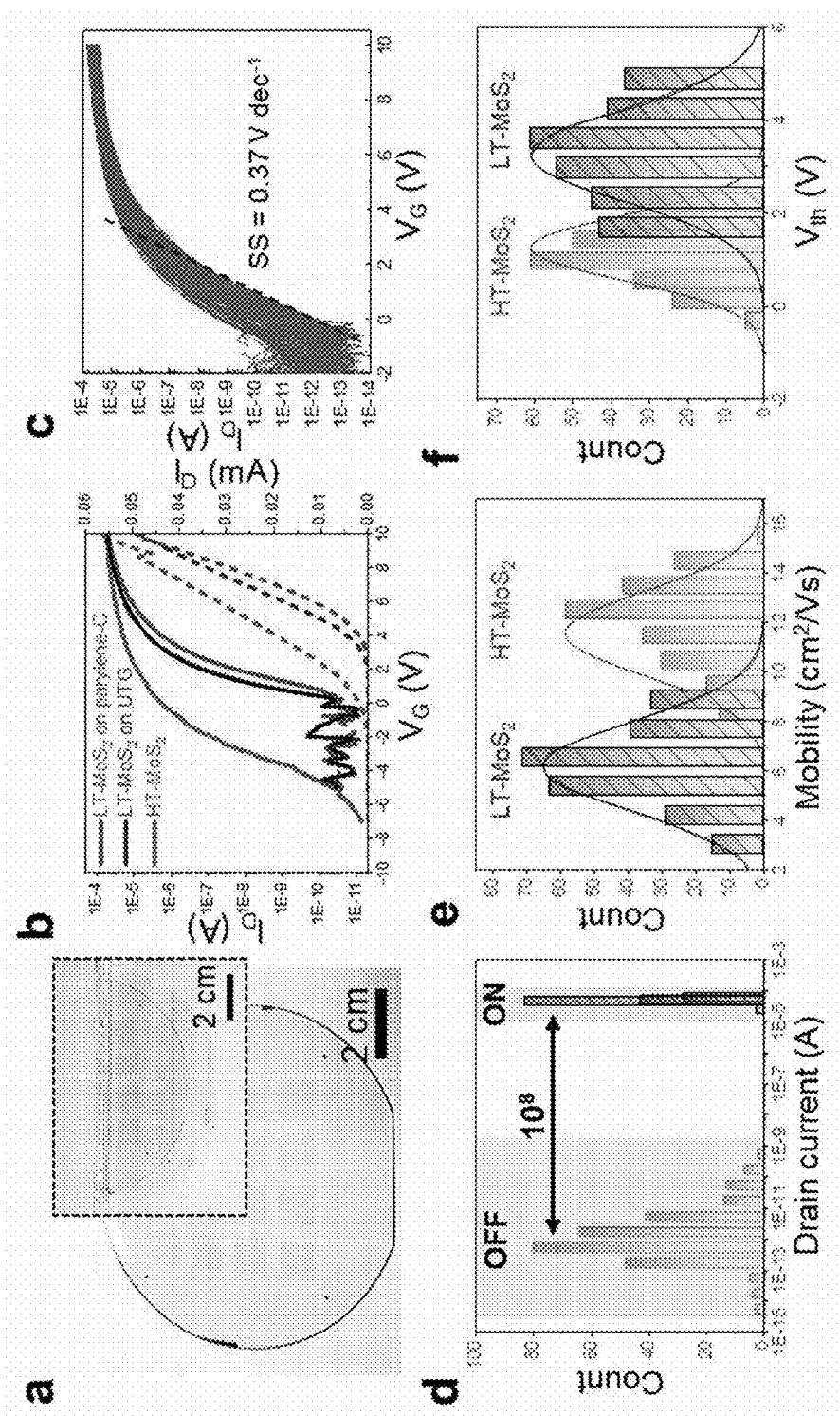

[FIG. 12]
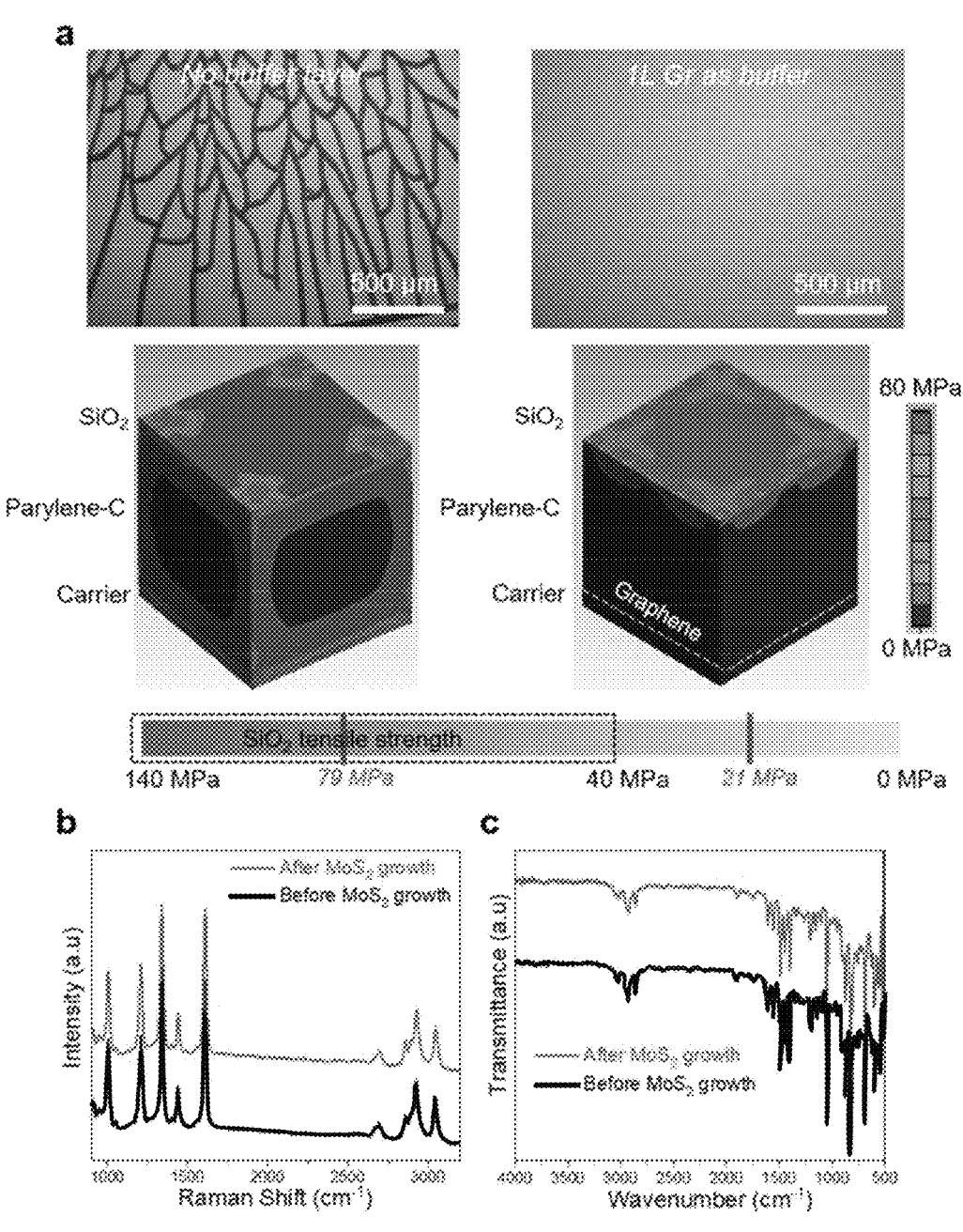

[FIG. 13]
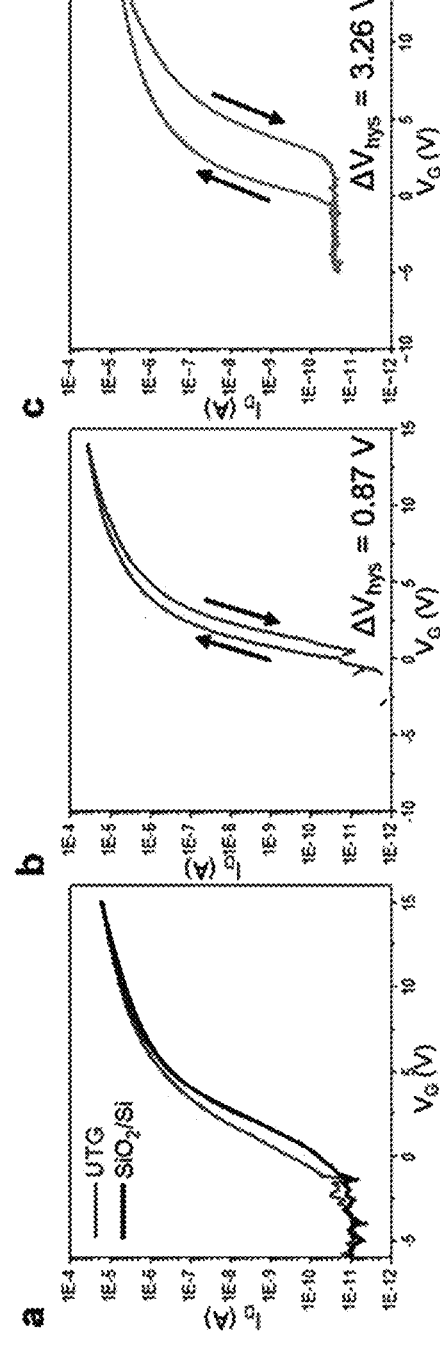

[FIG. 14]
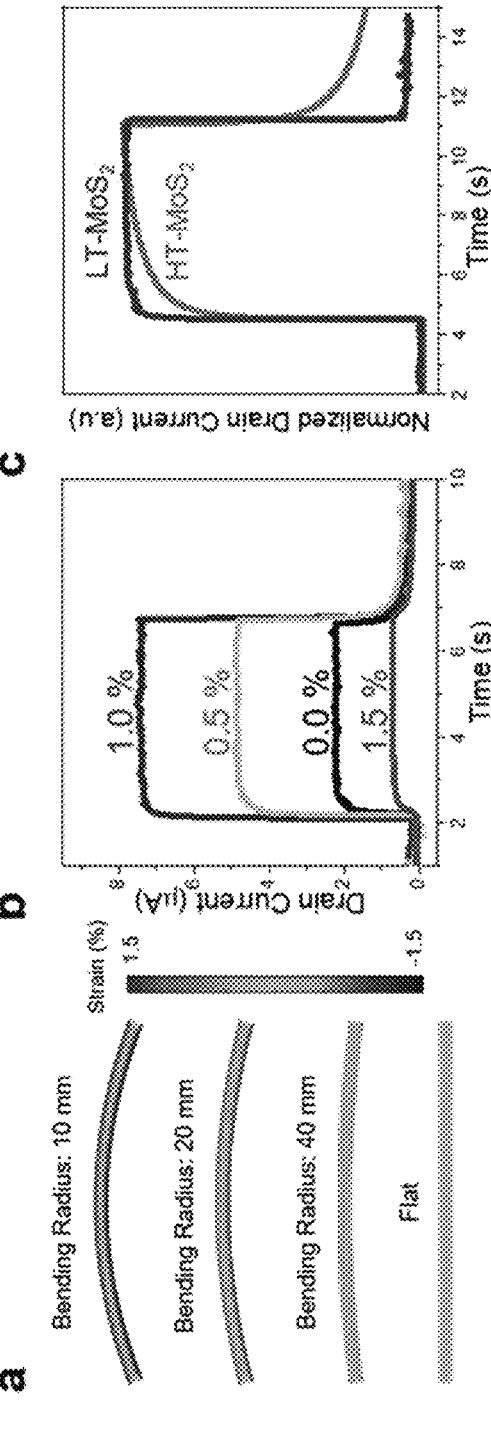

LOW TEMPERATURE SYNTHESIS METHOD OF TWO DIMENSIONAL MATERIAL

BACKGROUND OF THE INVENTION

Technical Field

The present disclosure relates to a synthesis method of a two dimensional material, and more particularly, to a method for synthesizing a transition metal dichalcogenides on a substrate using chemical vapor deposition.

Description of the Related Art

A flexible electronic device represents a next generation of electronic device with various applications from a flexible display to an electronic skin, a wearable sensor, and a flexible microprocessor. As compared with an existing rigid electronic device, the flexible electronic device has advantages of being lightweight, portable, wearable, and energy efficient. Recently, a two-dimensional (2D) semiconductor has received considerable attention as a flexible electronic device with their atomic level of thickness and superior mechanical, optical, and electrical properties to the existing 3D bulk semiconductor.

Development of the 2D semiconductor, specifically, the transition metal dichalcogenide (for example, molybdenum disulfide ($MoS_2$) has paved the way for producing the flexible electronic device having remarkable mechanical flexibility. The existing approach to manufacture $MoS_2$-based flexible electronic device is generally to synthesize $MoS_2$ on a rigid substrate at a high temperature and transfer it to a flexible substrate for manufacturing the device. However, there are problems in that a flexible substrate with a low melting temperature cannot be used in a high-temperature process and surface contamination, wrinkling, and tearing occur during the transfer process, causing deterioration of a material quality.

SUMMARY

An object to be achieved by the present disclosure is to provide a synthesis method of a 2D material which directly synthesizes a transition metal dichalcogenide which is a 2D material on a flexible substrate at a low temperature using chemical vapor deposition to implement a flexible electronic device without performing a transfer process.

In order to achieve the technical object, according to an aspect of the present disclosure, a synthesis method of a 2D material includes: preparing a substrate; maintaining a first zone of a furnace and a second zone adjacent to the first zone, in which the target substrate is disposed, at a first temperature and a second temperature which is lower than the first temperature; injecting carrier gas, a transition metal precursor, and a chalcogenide precursor into the first zone of the furnace; and depositing transition metal dichalcogenide on the target substrate in the second zone at the second temperature by the chemical vapor deposition.

In the depositing, in the first zone, a chemical reaction in which the transition metal precursor and the chalcogenide precursor are decomposed occurs.

At the first temperature, a chemical reaction in which the transition metal precursor and the chalcogenide precursor are decomposed occurs.

The second temperature is lower than a melting temperature of the target substrate while depositing the transition metal dichalcogenide on the target substrate.

In the injecting, a solution in which the transition metal precursor is dissolved in a chalcogenide precursor solvent is vaporized to inject the transition metal precursor and the chalcogenide precursor together.

In the injecting, the solution is bubbled with an inert gas to be vaporized.

The target substrate includes a ultra-thin glass (UTG), polyimide, parylene-C, $SiO_2$, or $AL_2O_3$ as a flexible base material.

The target substrate includes a carrier base material, a buffer layer formed on the carrier base material, a flexible base material formed on the buffer layer, and a passivation layer formed on the flexible base material.

The buffer layer is formed of graphene.

A length of the second zone is formed to be larger than a length of the first zone.

The first temperature is 400° C. to 850° C.

The second temperature is 100° C. to 400° C.

The target substrate includes a ultra-thin glass (UTG) or polyimide as a flexible base material and the second temperature is 100° C. to 400° C.

The target substrate includes parylene-C as a flexible base material and the second temperature is 100° C. to 200° C.

The transition metal precursor is a Mo precursor, the chalcogenide precursor is a S precursor, and the transition metal dichalcogenide is $MoS_2$.

The transition metal precursor is molybdenum hexacarbonyl (MHC).

The chalcogenide precursor is dimethyl sulfide (DMS).

The transition metal precursor is a Mo precursor or a W precursor, the chalcogenide precursor is a S precursor, a Se precursor, or a Te precursor, and the transition metal dichalcogenide is $MoS_2$, $MoSe_2$, $MoTe_2$, $WS_2$, $WSe_2$, or $WTeS_2$.

According to the present disclosure described above, the transition metal dichalcogenide which is a 2D material is directly synthesized on a flexible substrate at a low temperature using chemical vapor deposition to implement a flexible electronic device without performing the transfer process.

Further, according to the present disclosure, the 2D material may be synthesized to have a larger grain size and a lower level of defect as compared with a material synthesized by a high temperature process.

Further, the 2D material synthesized according to the present disclosure has a superior interfacial characteristic to the 2D material formed by the existing transfer process and is free to the contamination and wrinkle of the element to enable the development of a high performance flexible electronic device.

BRIEF DESCRIPTION OF THE DRAWINGS

FIG. 1 illustrates a flowchart of a synthesis method of a 2D material according to an exemplary embodiment of the present disclosure;

FIG. 2 illustrates a conceptual view of a synthesis method of a 2D material according to an exemplary embodiment of the present disclosure;

FIG. 3 illustrates an example of temperature distribution of a furnace of a synthesis method of a 2D material according to an exemplary embodiment of the present disclosure;

FIG. 4 illustrates an example of a target substrate of a synthesis method of a 2D material according to an exemplary embodiment of the present disclosure;

FIG. 5 illustrates an optical image and a SEM image of $MoS_2$ grown on an ultra-thin glass (UTG);

FIG. 6 is an atomic force microscopy (AFM) tomography of $MoS_2$ on an ultra-thin glass (UTG);

FIG. 7 illustrates ADF-TEM of a SAED pattern showing a desirable crystallinity in $MoS_2$;

FIG. 8 illustrates a DF-TEM image which shows an influence of a growth temperature on a grain size of $MoS_2$;

FIG. 9 illustrates a Mo—S binary phase diagram;

FIG. 10 illustrates uniformity and growth mechanism surveyed using density functional theory (DFT);

FIG. 11 illustrates comparison of $MoS_2$ synthesized at a low temperature and $MoS_2$ synthesized at a high temperature according to an exemplary embodiment of the present disclosure;

FIG. 12 illustrates optimization and evaluation of $MoS_2$ grown in parylene C;

FIG. 13 illustrates an $I_D$-$V_G$ transfer curve of FET using $MoS_2$ grown at a low temperature; and FIG. 14 illustrates evaluation of $MoS_2$ based photo detector.

DETAILED DESCRIPTION OF THE EMBODIMENT

Hereinafter, exemplary embodiments of the present disclosure will be described in detail with reference to the drawings. Substantially same components in the following description and the accompanying drawings may be denoted by the same reference numerals and redundant description will be omitted. Further, in the description of the exemplary embodiment, if it is considered that specific description of related known configuration or function may cloud the gist of the present disclosure, the detailed description thereof will be omitted.

The chemical vapor deposition (CVD) of a 2D material including metalorganic chemical vapor deposition (MOCVD) requires a high process temperature of approximately 500° C. so that it is not possible to synthesize a ultra-thin glass (UTG) (400 to 450° C.) or a plastic substrate (100 to 400° C.) having a low glass transition temperature. According to exemplary embodiments of the present disclosure, the synthesis temperature of the 2D material is lowered to a low temperature (for example, 100 to 400° C.) to enable the synthesis of 2D material even on various flexible substrates such as ultra-thin glass or a plastic substrate (polyimide or parylene-C) as well as a wafer. To this end, according to the exemplary embodiments of the present disclosure, a furnace for 2D material synthesis is divided into a high temperature zone (for example, 400 to 850° C.) in which chemical reaction of a precursor occurs and a low temperature zone (for example, 100 to 400° C.) in which deposition on a substrate occurs. Further, exemplary embodiments of the present disclosure use a technique of injecting a transition metal precursor and a chalcogenide precursor together by improving a method of separately injecting the transition metal precursor and the chalcogenide precursor to synthesize the transition metal dichalcogenides. These techniques enable superior material synthesis to the existing technique by maintaining vapor pressures of a precursor having different vapor pressures at a similar level. The 2D material synthesized according to the exemplary embodiments of the present disclosure may have a larger grain size and a lower level of defect as compared with the material synthesized by a high temperature process. Further, the 2D material synthesized according to the exemplary embodiments of the present disclosure has a superior interfacial characteristic to the 2D material formed by the existing transfer process and is free to the contamination and wrinkle of the element to enable the development of a high performance flexible electronic device. According to the exemplary embodiments of the present disclosure, a high performance transistor is manufactured based thereon, various logic elements and integrated elements, such as NAND, AND, NOR, OR, NOT, a signal amplifier, or a ring oscillator, are manufactured as a flexible type, and a quick and excellent photo sensor on various flexible substrates utilizing a low defect characteristic is manufactured.

Hereinafter, according to the exemplary embodiments, an example of synthesizing $MoS_2$ (molybdenum disulfide) using a Mo precursor as a transition metal precursor and a S precursor as a chalcogenide precursor has been described. It is understood by those skilled in the art that the present disclosure is applied to synthesize various transition metal chalcogenides using various transition precursors and various chalcogenide precursors. For example, a Mo precursor or a W precursor is used as the transition metal precursor and a S precursor, a Se precursor, or a Te precursor is used as a chalcogenide precursor so that $MoS_2$, $MoSe_2$, $MoTe_2$, $WS_2$, $WSe_2$, or $WTe_2$ are synthesized as transition metal dichalcogenides according to the exemplary embodiment of the present disclosure.

FIG. 1 illustrates a flowchart of a synthesis method of a 2D material according to an exemplary embodiment of the present disclosure. FIG. 2 illustrates a conceptual view of a synthesis method of a 2D material according to an exemplary embodiment of the present disclosure. FIG. 3 illustrates an example of temperature distribution of a furnace of a synthesis method of a 2D material according to an exemplary embodiment of the present disclosure. FIG. 4 illustrates an example of a target substrate of a synthesis method of a 2D material according to an exemplary embodiment of the present disclosure.

In step S110, a target substrate to synthesize a 2D material is prepared.

The target substrate 300 includes a carrier base material 310, a buffer layer 320 formed on the carrier base material 310, a flexible base material 330 formed on the buffer layer 320, and a passivation layer 340 formed on the flexible base material 330.

The carrier base material 310 is formed of $SiO_2$. The buffer layer 320 is formed of graphene. The flexible base material 330 is formed of ultra-thin glass (UTG), polyimide, parylene-C, $SiO_2$, or $Al_2O_3$. The passivation layer 340 is formed of $SiO_2$ or $Al_2O_3$.

In step S120, a first zone 210 of the furnace 200 and a second zone 220 adjacent to the first zone 210 are maintained at a first temperature and a second temperature lower than the first temperature, respectively. The target substrate 300 is disposed in the second zone 220 of the furnace 200. The first temperature is set to 400° C. to 850° C. (or 550° C. to 850° C.) to supply a sufficient energy to occur a chemical reaction to decompose the precursor. The second temperature is set to 100° C. to 400° C. which is lower than a melting temperature of the target substrate 300 so as not to melt or deteriorate the target substrate 300 while depositing $MoS_2$ on the target substrate 300.

The second temperature is set to be different according to the target substrate 300. For example, when the target substrate 300 is ultra-thin glass (UTG) or polyimide, the second temperature is set to 100° C. to 400° C. When the target substrate 300 is parylene-C, the second temperature is set to 100° C. to 200° C.

A length of the second zone 220 is formed to be longer than a length of the first zone 210 to minimize a temperature gradient. The target substrate 300 is disposed to be sufficiently spaced apart from a boundary of the first zone 210 and the second zone 220 to maintain the second temperature.

In step S130, a carrier gas, a Mo precursor, and a S precursor are injected into the first zone 210 of the furnace 200.

The carrier gas includes Ar and H$_2$. The Mo precursor may be molybdenum hexacarbonyl (MHC, Mo(CO)$_6$). The S precursor may be dimethyl sulfide (DMS, C$_2$H$_6$S).

According to the exemplary embodiment of the present disclosure, the Mo precursor and the S precursor are injected together by vaporizing a solution in which the Mo precursor is dissolved in the S precursor solvent. That is, a solution in which the MHC is dissolved in the DMS solvent is vaporized to inject the MHC and DMS together. At this time, the solution in which the MHC is dissolved in the DMS solvent is bubbled with an inert gas (for example Ar) to be vaporized. According to the exemplary embodiment of the present disclosure, an excellent quality of MoS$_2$ can be synthesized by maintaining the vapor pressures of MHC and DMS at a similar level.

When MHC (Mo(CO)$_6$) is dissolved in the DMS (C$_2$H$_6$S) solvent, chemical reaction of Mo(CO)$_6$→Mo(CO)$_5$(DMS) occurs in the solution. This is a ligand exchange based chemical reaction in which one of CO (carbonyl) groups is removed from existing MHC and DMS is bonded in its place. The precursor formed in this way may be spontaneously decomposed even at a low temperature (for example, 150° C.). In contrast, generally, the existing MHC is spontaneously decomposed at a high temperature of 700° C. or higher. A new precursor formed by the ligand exchange reaction is easily decomposed even at a low temperature to enable a high quality of MoS$_2$ synthesis at a low temperature.

In step S140, in the first zone 210, a chemical reaction in which MHC and DMS are decomposed by the first temperature and in the second zone 220, MoS$_2$ is deposited on the target substrate 300 at the second temperature by the chemical vapor deposition. Accordingly, MoS$_2$ is deposited on the flexible base material 330 of the target substrate 300 without using the transfer process.

Referring to FIG. 3_a_, the second zone 220 is set to 150° C. to synthesize MoS$_2$ while protecting the target substrate 300 of a low melting point. In order to set the first temperature and the second temperature, 3-zone furnace (2-zone furnace is also available) may be utilized. The second zone 220 is maintained at 150° C. to deposit MoS$_2$ on the flexible substrate, but the first zone 210 is heated to 700° C. to supply a sufficient energy for MoS$_2$ forming reaction. In the design, the first zone 210 which is a reaction area has a length of 30 cm and includes an active heating area with a length of 20 cm which is maintained at 700° C. The second zone 220 which is a deposition area has a length of 50 cm to minimize the temperature gradient and has an active heating area with a length of 40 cm which is maintained at 150° C. A distance between an edge of the first zone 210 and the target substrate 300 may be set to approximately 35 cm to maintain the target substrate 300 at a desired temperature. Referring to FIG. 3_b_, the heat distribution indicates that the target substrate 300 is maintained at a low and stable temperature of 150° C.

Referring to FIG. 4, it is illustrated that a parylene-C substrate synthesized with MoS$_2$ is detached from the carrier substrate. In order to grow a high quality of MoS$_2$, a passivation layer 340 which is formed of SiO$_2$ or Al$_2$O$_3$ may reduce carbon contamination and a surface roughness of polymer. Further, the adhesiveness between the parylene-C and the carrier substrate after a growing process for a long period is improved, which makes it difficult to detach the polymer substrate. Therefore, the graphene grown by the CVD is used as a buffer layer 320 to easily perform the lift-off process. When a monolayer graphene is used as the buffer layer 320, polymer including MoS$_2$ is easily peeled off from a carrier substrate without causing the crack.

The inventor carried out the MoS$_2$ synthesis process according to the exemplary embodiment of the present disclosure as follows. MHC (purity≥99.9%) and anhydrous DMS (purity≥99.0%) are used as precursors. A solution is prepared by dissolving 60 mg of MHC in 10 mL of DMS and is stored in a glass bubbler at the outside of the furnace. An injected amount of precursor is precisely controlled using a mass flow controller. A pressure is additionally maintained at 8 Torr using a pressure control device. A mixture of Ar and H$_2$ (680 sccm of Ar and 1 sccm of H$_2$) is used as a carrier gas and is constantly maintained during the process. A continuous MoS$_2$ film was obtained starting with a 0.60 sccm mixture (MHC+DMS) for the first one hour of the nucleation step and increasing to 2.75 sccm for the next 31 hours of the growing step.

FIG. 5 illustrates an optical image and a SEM image of MoS$_2$ grown on an ultra-thin glass (UTG). FIG. 5 illustrates that MoS$_2$ is grown on a 4-inch UTG wafer with a thickness of 30 μm by the similar method to a polymer substrate.

FIG. 6 is an atomic force microscopy (AFM) tomography of MoS$_2$ on an ultra-thin glass (UTG). FIG. 6 illustrates that a monolayer MoS$_2$ was uniformly and continuously grown on the substrate.

FIG. 7 illustrates ADF-TEM of a SAED pattern showing a desirable crystallinity in MoS$_2$. FIG. 7 shows that MoS$_2$ deposited at a low temperature has a high crystallinity.

FIG. 8 illustrates an DF-TEM image which shows an influence of a growth temperature on a grain size of MoS$_2$. FIG. 8 shows that a size of a MoS$_2$ area is increased as an additional advantage of a low deposition temperature.

FIG. 9 illustrates an Mo—S binary phase diagram. Referring to FIG. 9, a 2H phase MoS$_2$ is formed in a rich S environment. The 2H phase MoS$_2$ is easily detached at a high growth temperature due to a high vapor pressure of sulfur, which results in a harsh S environment which may end up forming Mo2S3, rather than MoS2. Accordingly, a sufficient amount of S is requested. In the meantime, FIG. 9 shows that a high synthesis temperature is required to reduce a width of MoS2 2H phase, which indicates the reduction in defects. That is, a high growth temperature is preferred to obtain a high quality MoS$_2$. As described above, Mo—S binary phase diagram represents that a growth temperature significantly affects the MoS$_2$ quality. Accordingly, it is not easy to obtain a high quality MoS$_2$ at the low temperature. However, in the exemplary embodiment of the present disclosure, a low temperature is selected to synthesize MoS$_2$ while protecting the substrate with a low melting point. Accordingly, in the exemplary embodiment of the present disclosure, in order to overcome the low temperature growth problem, the second zone 220 of the furnace 200 is maintained at a low temperature (for example, 150° C.), but the first zone 210 of the furnace 200 is maintained at a high temperature (for example, 700° C.) to supply a sufficient energy for MoS$_2$ forming reaction. A PL strength of MoS$_2$ sample is greatly reduced by reducing the growth temperature and disappears when the MoS2 is grown at a temperature of 500° C. or lower, which coincides the prediction of a phase diagram. When the first zone 210 of the furnace 200 is raised to 700° C., it is sufficient to decompose the precursor and form a high quality of MoS$_2$.

FIG. 10 illustrates uniformity and growth mechanism surveyed using density functional theory (DFT). a to c indicate Raman, PL, and UV-Vis absorption spectrums in a randomly selected area. d and e illustrate XPS analysis of a survey scan (d) and a core level spectrum (e) of LT-MoS$_2$ and HT-MoS$_2$. f to h illustrate a growth mechanism surveyed using DFT, showing thermodynamics of the thermal molecular decomposition of MHC (f), DMS(g), and Mo(CO)$_5$(DMS). i illustrates chemical structures of Mo(CO)$_5$(DMS) and a decomposed product thereof. FIG. 10 illustrates that the precursor by a solution in which MHC is dissolved in the DMS solvent is easily decomposed at a low temperature of 150° C.

Raman and PL measurement were performed in 60 places which are randomly selected to confirm the uniformity of MoS$_2$ film grown on the wafer and UV-Vis absorption was measured in additional 10 places. Raman, PL, and UV-Vis absorption spectrums recorded in different places are the same and indicate the uniformity of the MoS$_2$ film over the entire wafer. Further, the XPS analysis shows an additional advantage of a low temperature growing temperature (d-e of FIG. 10). Thermal decomposition of each reactant may affect the stoichiometry of materials synthesized by MOCVD. To gain further insight into the chemistry and thermodynamics of the low-temperature synthesis of MoS$_2$ which is not possible in the related art, possible chemical reactions inside the MOCVD chamber were simulated using DFT calculations (f and g of FIG. 10). DMS may be spontaneously decomposed at 150° C., but decomposition of Mo precursor (MHC) requires a high temperature, such as 700° C. In contrast, when the Mo precursor is dissolved in the DMS solvent, a portion of the Mo precursor may form a complex with DMS through ligand exchange, resulting in Mo(CO)$_5$(DMS) as an intermediate. Interestingly, Mo(CO)$_5$(DMS) has a greatly increased tendency of decomposition to be spontaneously decomposed at 150° C. in the Mo—S bond preserved state. Accordingly, according to the exemplary embodiment of the present disclosure, the Mo precursor and the S precursor are simultaneously injected to improve low temperature synthesis of MoS$_2$.

FIG. 11 illustrates comparison of MoS$_2$ synthesized at a low temperature and MoS$_2$ synthesized at a high temperature according to an exemplary embodiment of the present disclosure. Hereinafter, for the sake of convenience, according to the exemplary embodiment of the present disclosure, MoS$_2$ synthesized at the low temperature is represented as LT-MoS$_2$ and MoS$_2$ synthesized at the high temperature is represented as HT-MoS$_2$. a illustrates an optical image of a MoS$_2$ TFT array on the UTG. An inserted image illustrates an optical image of MoS$_2$ TFT array on parylene-C folded on a glass tube with a diameter of 5 mm. b illustrates the I-V transfer characteristic of HT-MoS$_2$, LT-MoS$_2$ on the parylene-C, and LT-MoS$_2$ on the UTG. C illustrates the uniformity of LT-MoS$_2$ TFT array. d illustrates a histogram of an ON-OFF current. e and f illustrate a histogram of a mobility and a threshold voltage of MoS$_2$ TFT obtained by comparing LT-MoS$_2$ and HT-MoS$_2$ samples.

In order to verify a quality of LT-MoS2 as an active material for an electronic device, a top-gate field effect transistor (FET) is manufactured on both the UTG and the plastic substrate. FIG. 11a illustrates an optical image of an MoS2 FET array in a 4-inch wafer scale UTG and a folded parylene-C (inserted image). Referring to FIG. 11b, a transfer characteristic I$_D$-V$_G$ of HT-MoS$_2$ and LT-MoS$_2$ samples shows that the HT-MoS$_2$ based FET operates in a depletion mode and the LT-MoS$_2$ based FET operates in all flexible substrates in an enhancement mode. FIG. 11c illustrates a transfer characteristic which is randomly extracted from 250 FETS on the UTG. This shows the uniformity of LT-MoS$_2$ having a subthreshold slope of 370 mV/decade and a high ON/OFF ratio of 108. Referring to FIGS. 11 e and f, LT-MoS$_2$ FET shows a highest mobility of 9.1 cm$^2$V$^{-1}$ s$^{-1}$ and an average of 6.5±2.6 cm$^2$V$^{-1}$ s$^{-1}$, which are lower than HT-MoS$_2$ FET due to a low S vacancy concentration. Instead, the LT-MoS$_2$ FET shows a positive threshold voltage V$_{th}$, which enables a low-power operation by reducing a leakage current in an off state so that it is an essential characteristic of a stable operation of various electronic devices.

FIG. 12 illustrates optimization and evaluation of MoS$_2$ grown in parylene C. Referring to a, in order to reduce a tensile stress in the SiO$_2$ passivation layer, graphene is used between the carrier base material and the parylene-C as a buffer layer. The graphene buffer layer reduces an internal tensile stress accumulated in the SiO$_2$ passivation layer to suppress a crack. According to the exemplary embodiment, the graphene buffer layer is also used between the parylene-C and the SiO$_2$ passivation layer. The FEA simulation was performed by setting an interval of interfaces of the layers and a sliding condition at 150° C. which is a growth temperature of LT-MoS$_2$. The internal stress accumulation is reduced below a critical point of SiO$_2$ to suppress a crack. band c illustrate Raman and FTIR spectrums of the parylene-C before growing and after growing MoS$_2$. b and c represent that the parylene-C was stored after growing MoS$_2$.

FIG. 13 illustrates an I$_D$-V$_G$ transfer curve of FET using MoS$_2$ grown at a low temperature. a illustrates comparison of MoS$_2$ grown on a UTG and a SiO$_2$/Si wafer. b illustrates a hysteresis of low-temperature grown MoS$_2$. c illustrates a hysteresis of LT-MoS$_2$ FET by transferring MoS$_2$ onto another SiO$_2$/Si substrate for manufacturing. Referring to FIG. 13a, MoS$_2$ produced in the UTG and the polymer has a similar quality to that formed on a typical SiO$_2$/Si substrate, so that it is understood that the UTG and the polymer may be used as a substrate suitable for 2D material synthesis. Referring to FIG. 13b, a low S-pore reduces a trapped voltage to obtain a narrow hysteresis voltage window of 0.87 V. Referring to FIG. 13c, it is understood that when the device is directly manufactured on the grown substrate, the disadvantage of the transfer process, such as a conversion trap effect due to the contaminated interface which causes a severe hysteresis can be avoided.

FIG. 14 illustrates evaluation of MoS$_2$ based photo detector. a illustrates various bending steps by the FEA simulation. b illustrates a tensile strain effect on the photoresponse of LT-MoS$_2$. The photoresponsivity of LT-MoS$_2$ is improved by up to 1% strain due to the bandgap modulation effect. However, at the strain of 1.5%, the overall photoresponse is degraded due to microcracks in the MoS$_2$ channel. c illustrates a normalized I$_{ph}$ of the LT-MoS$_2$ and HT-MoS$_2$ based photo detector. A larger amount of S-pores in the HT-MoS$_2$ causes the trap charges, which causes a long decay time due to a long rising time of 1410 ms and a persistent photocurrent effect. As compared with the HT-MoS$_2$, a rising time Tr and a falling time Tf of LT-MoS$_2$ are 90 ms and 280 ms, which shows a quicker photoresponse. The fast photoresponse of the phototransistor indicates that LT-MoS$_2$ contains a lower amount of defects.

According to the exemplary embodiment of the present disclosure, a high quality of MoS$_2$ may be synthesized on various flexible substrates, such as polymer and UTG, at a low temperature using the MOCVD technique. The low-temperature grown MoS2 on the flexible substrate shows a low S-pore concentration to enable the operation of the FET in the enhancement mode with a positive threshold voltage. Further, the electronic devices and the photo detectors are directly manufactured on the flexible substrate without a separate transfer process to suppress contamination, wrinkles, and torn phenomenon to maintain the quality of $MoS_2$ as it is. The low-temperature growth approach according to the exemplary embodiment of the present disclosure enables the manufacturing of improved flexible electronic device based on the 2D material.

Further, the existing 2D material synthesis method including the metalorganic chemical vapor deposition (MOCVD) requires a high process temperature of 500° C. so that it is not possible to be compatible with back end of line (BEOL) or front end of line (FEOL) semiconductor processes of the related art. However, according to the synthesis method of the 2D material according to the exemplary embodiment of the present disclosure, low-temperature synthesis is possible so that it is possible to be compatible with BEOL (which requires lower than 400° C.) or FEOL (which requires lower than 700° C.) semiconductor processes of the related art. Accordingly, the 2D material synthesized according to the exemplary embodiment of the present disclosure may enable the manufacturing of semiconductor chips for various purposes such as computing or sensors.

It will be appreciated that the technical spirit of the present disclosure has been described herein for purposes of illustration, and that various modifications and changes may be made by those skilled in the art without departing from the scope and spirit of the present disclosure. Therefore, the exemplary embodiments of the present disclosure are provided for illustrative purposes only but not intended to limit the technical concept of the present disclosure. The scope of the technical concept of the present disclosure is not limited thereto. The protection scope of the present disclosure should be interpreted based on the following appended claims and it should be appreciated that all technical spirits included within a range equivalent thereto are included in the protection scope of the present disclosure.

What is claimed is:

1. A synthesis method of a two-dimensional material, comprising:
  preparing a substrate;
  maintaining a first zone of a furnace and a second zone adjacent to the first zone, in which the target substrate is disposed, at a first temperature and a second temperature which is lower than the first temperature;
  injecting a carrier gas, a transition metal precursor, and a chalcogenide precursor into the first zone of the furnace; and
  depositing transition metal dichalcogenide on the target substrate in the second zone at the second temperature by chemical vapor deposition, thereby forming the two-dimensional material,
  wherein in the injecting, a solution in which the transition metal precursor is dissolved in a chalcogenide precursor solvent is vaporized to inject the transition metal precursor and the chalcogenide precursor together, and
  wherein in the injecting, the solution is bubbled with an inert gas to be vaporized.

2. The synthesis method of the two-dimensional material according to claim 1, wherein in the depositing, in the first zone, a chemical reaction in which the transition metal precursor and the chalcogenide precursor are decomposed occurs.

3. The synthesis method of the two-dimensional material according to claim 2, wherein at the first temperature, a chemical reaction in which the transition metal precursor and the chalcogenide precursor are decomposed occurs.

4. The synthesis method of the two-dimensional material according to claim 3, wherein the first temperature is 400° C. to 850° C.

5. The synthesis method of the two-dimensional material according to claim 1, wherein the second temperature is lower than a melting temperature of the target substrate while depositing the transition metal dichalcogenide on the target substrate.

6. The synthesis method of the two-dimensional material according to claim 5, wherein the second temperature is 100° C. to 400° C.

7. The synthesis method of the two-dimensional material according to claim 1, wherein the target substrate includes a glass, polyimide, parylene-C, $SiO_2$, or $AL_2O_3$ as a flexible base material.

8. The synthesis method of the two-dimensional material according to claim 1, wherein the target substrate includes a carrier base material, a buffer layer formed on the carrier base material, a flexible base material formed on the buffer layer, and a passivation layer formed on the flexible base material.

9. The synthesis method of the two-dimensional material according to claim 8, wherein the buffer layer is formed of graphene.

10. The synthesis method of the two-dimensional material according to claim 1, wherein a length of the second zone is formed to be larger than a length of the first zone.

11. The synthesis method of the two-dimensional material according to claim 1, wherein the target substrate includes a glass or polyimide as a flexible base material and
  the second temperature is 100° C. to 400° C.

12. The synthesis method of the two-dimensional material according to claim 1, wherein the target substrate includes parylene-C as a flexible base material and the second temperature is 100° C. to 200° C.

13. The synthesis method of the two-dimensional material according to claim 1, wherein the transition metal precursor is a Mo precursor, the chalcogenide precursor is a S precursor, and the transition metal dichalcogenide is $MoS_2$.

14. The synthesis method of the two-dimensional material according to claim 13, wherein the transition metal precursor is molybdenum hexacarbonyl (MHC).

15. The synthesis method of the two-dimensional material according to claim 13, wherein the chalcogenide precursor is dimethyl sulfide (DMS).

16. The synthesis method of the two-dimensional material according to claim 1, wherein the transition metal precursor is a Mo precursor or a W precursor, the chalcogenide precursor is a S precursor, a Se precursor, or a Te precursor, and the transition metal dichalcogenide is $MoS_2$, $MoSe_2$, $MoTe_2$, $WS_2$, $WSe_2$, or $WTeS_2$.

* * * * *